US010229811B2

United States Patent
Mizuhara et al.

(10) Patent No.: US 10,229,811 B2
(45) Date of Patent: Mar. 12, 2019

(54) CHARGED PARTICLE BEAM INCLINATION CORRECTION METHOD AND CHARGED PARTICLE BEAM DEVICE

(71) Applicant: Hitachi High-Technologies Corporation, Minato-ku, Tokyo (JP)

(72) Inventors: Yuzuru Mizuhara, Tokyo (JP); Hideyuki Kazumi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/025,713

(22) PCT Filed: Oct. 2, 2014

(86) PCT No.: PCT/JP2014/076400
§ 371 (c)(1),
(2) Date: Mar. 29, 2016

(87) PCT Pub. No.: WO2015/050201
PCT Pub. Date: Apr. 9, 2015

(65) Prior Publication Data
US 2016/0217969 A1    Jul. 28, 2016

(30) Foreign Application Priority Data
Oct. 3, 2013  (JP) .................................. 2013-208415

(51) Int. Cl.
*H01J 37/147*    (2006.01)
*H01J 37/04*    (2006.01)

(52) U.S. Cl.
CPC .......... *H01J 37/1478* (2013.01); *H01J 37/04* (2013.01); *H01J 37/147* (2013.01);
(Continued)

(58) Field of Classification Search
USPC ......................................................... 250/310
See application file for complete search history.

(56) References Cited

U.S. PATENT DOCUMENTS 4,983,832 A    1/1991 Sato
6,570,156 B1 *  5/2003 Tsuneta .................. H01J 37/26
                                                                250/311
(Continued)

FOREIGN PATENT DOCUMENTS

JP    2-33843 A    2/1990
JP    6-203777 A    7/1994
(Continued)

OTHER PUBLICATIONS

International Search Report (PCT/ISA/210) issued in PCT Application No. PCT/JP2014/076400 dated Dec. 9, 2014 with English translation (Four (4) pages).
(Continued)

*Primary Examiner* — Phillip A Johnston
(74) *Attorney, Agent, or Firm* — Crowell & Moring LLP

(57) ABSTRACT

With conventional optical axis adjustment, a charged particle beam will not be perpendicularly incident to a sample, affecting the measurements of a pattern being observed. Highly precise measurement and correction of a microscopic inclination angle are difficult. Therefore, in the present invention, in a state where a charged particle beam is irradiated toward a sample, a correction of the inclination of the charged particle beam toward the sample is performed on the basis of secondary electron scanning image information from a reflector plate. From the secondary electron scanning image information, a deviation vector for charged particle beam deflectors is adjusted, causing the charged particle beam to be perpendicularly incident to the sample. At least two stages of charged particle beam deflectors are provided.

15 Claims, 8 Drawing Sheets

(52) U.S. Cl.
CPC .......... *H01J 2237/0473* (2013.01); *H01J 2237/0475* (2013.01); *H01J 2237/24592* (2013.01); *H01J 2237/2817* (2013.01)

(56) References Cited

U.S. PATENT DOCUMENTS

| | | | |
|---|---|---|---|
| 6,573,508 B1 | 6/2003 | Ito | |
| 7,394,070 B2 * | 7/2008 | Nozoe | G01R 31/307 250/306 |
| 7,449,690 B2 * | 11/2008 | Nishiyama | H01J 37/244 250/208.1 |
| 9,208,994 B2 * | 12/2015 | Ohshima | H01J 37/265 |
| 2003/0111619 A1 | 6/2003 | Ito | |
| 2007/0284542 A1 | 12/2007 | Ogashiwa et al. | |
| 2013/0146766 A1 * | 6/2013 | Ohshima | H01J 37/265 250/310 |

FOREIGN PATENT DOCUMENTS

| | | |
|---|---|---|
| JP | 2000-17351 A | 6/2000 |
| JP | 2000-331911 A | 11/2000 |
| JP | 2002-216684 A | 8/2002 |
| JP | 2003-157784 A | 5/2003 |
| JP | 2008-84823 A | 4/2008 |
| JP | 2011-54426 A | 3/2011 |
| JP | 2012-43599 A | 3/2012 |
| WO | WO 2012/023354 A1 | 2/2012 |

OTHER PUBLICATIONS

Japanese-language Written Opinion (PCT/ISA/237) issued in PCT Application No. PCT/JP2014/076400 dated Dec. 9, 2014 (Four (4) pages).

* cited by examiner

CHARGED PARTICLE BEAM INCLINATION CORRECTION METHOD AND CHARGED PARTICLE BEAM DEVICE

TECHNICAL FIELD

The present disclosure relates to a charged particle beam device and is applicable, for example, to a charged particle beam device for correcting charged particle beam inclination.

BACKGROUND ART

Along with a progress of recent semiconductor devices, semiconductor measurement and inspection techniques are becoming increasingly important. A scanning electron microscope represented by a critical dimension-scanning electron microscope (CD-SEM) is a device for observing a pattern formed on a semiconductor device by performing electron beam scanning over a sample and then detecting a secondary electron emitted from the sample. In order to perform highly precise measurement and inspection on the device like this, it is required to set device conditions properly.

For example, optical axis adjustment of an electron microscope has been disclosed as an optical axis adjustment method using a deflector and a wobbler method in JP 2000-331911 A (PTL 1), JP 2008-084823 A (PTL 2), and JP 2011-054426 A (PTL 3). The deflector deflects an electron beam emitted from an electron source. The wobbler method periodically changes an excitation current of an objective lens.

CITATION LIST

Patent Literatures

PTL 1: JP 2000-331911 A
PTL 2: JP 2008-084823 A
PTL 3: JP 2011-054426 A

SUMMARY OF INVENTION

Technical Problem

Recently, device patterns with deep grooves and deep holes are remarkably increasing, making observation of the patterns with a scanning electron microscope very difficult. In observation with a scanning electron microscope, inclined incidence of an electron beam on a sample surface may cause a pattern to be observed unevenly. Inclined incidence of the electron beam would not have much influence on a pattern with a small aspect ratio. However, in a case of patterns with deep grooves and deep holes having the aspect ratio of several tens, such as a NAND flash memory and a contact hole in recent years, inclined incidence of the electron beam would cause unevenness in observation of the pattern, leading to a failure in high-precision measurement.

Techniques described in PTL 1, PTL 2 and PTL 3 are techniques to perform automatic adjustment of an optical axis of the electron beam so as to achieve a state in which an observed pattern does not move when wobbling of the objective lens is executed. Each of the literatures describes a technique to allow the electron beam to pass through a center of an electron lens included in the electron microscope.

Unfortunately, however, since a mechanical tolerance is inevitably present in an actual device, a plurality of electron lenses is not arranged concentrically. With such a device state, even when an electron beam is emitted through the center of the objective lens arranged immediately above the sample, the electron beam is incident with inclination to the objective lens. Accordingly, the electron beam is not incident perpendicularly to the sample even at a stage when the electron beam reaches the sample. On a device pattern with the aspect ratio of several tens as described above, when the electron beam has an inclination angle of about 0.10, it might have a non-negligible influence on the measurement. From the above, in observation of patterns with a deep groove and a deep hole in recent years, it is necessary to achieve an optical axis of an electron beam that passes through the center of the objective lens and is incident perpendicularly to the sample.

An object of the present disclosure is to provide a method to correct a microscopic inclination angle of a charged particle beam.

Other objects and novel features will become apparent from description and attached drawings of the present disclosure.

Solution to Problem

Typical techniques of the present disclosure will be briefly described as below.

In a charged particle beam inclination correction method, inclination correction of the charged particle beam is performed based on information, obtained on a reflector plate, regarding a scanned image with an emitted charged particle emitted from a sample. The reflector plate is arranged between a charged particle source and an objective lens to focus the charged particle beam.

Advantageous Effects of Invention

According to the above-described charged particle beam inclination correction method, it is possible to correct a microscopic inclination angle of the charged particle beam.

BRIEF DESCRIPTION OF DRAWINGS

FIG. 3A illustrates a case where the primary electron beam is not inclined. FIG. 3B illustrates a case where the primary electron beam is inclined.

DESCRIPTION OF EMBODIMENTS

Hereinafter, embodiments and examples will be described with reference to the drawings. Note that, in the description below, a same sign will be put to same components and repetitive description will be omitted. In the following, a scanning electron microscope (SEM) that performs electron beam scanning over a sample will be described as an example. The technique is not limited to this but is applicable, for example, to other charged particle beam devices including a focused ion beam (FIB) device. The present embodiment describes merely an exemplary scanning electron microscope. The present technique is applicable to a scanning electron microscope having a configuration different from the present embodiment.

Embodiment

Figure 1:
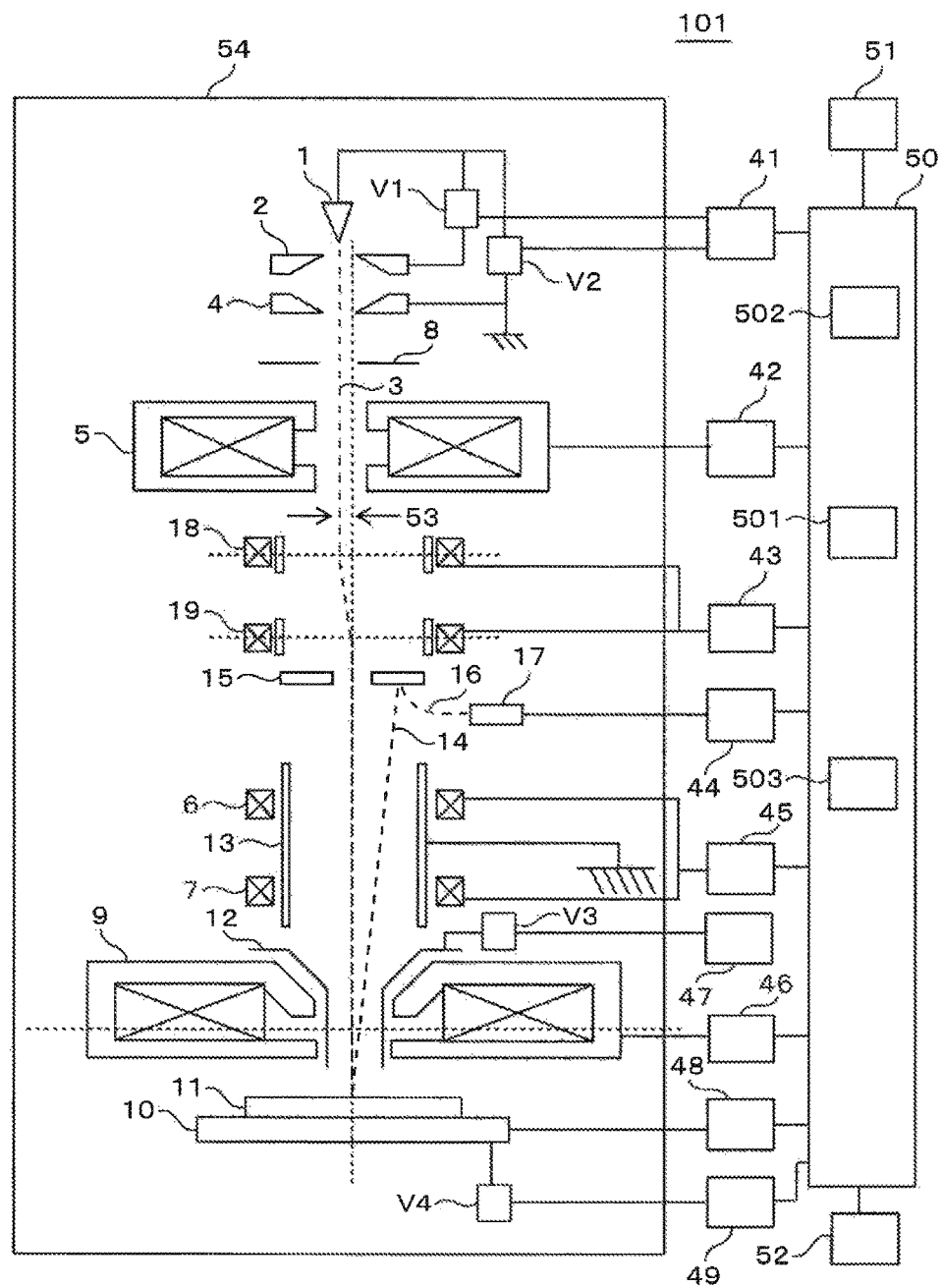
FIG. 1 is a diagram illustrating a configuration of a scanning electron microscope.

FIG. 1 is a diagram illustrating a configuration of a scanning electron microscope. FIG. 1 illustrates a device state in which mechanical axis deviation is occurring for the purpose of exhibiting a concept of electron beam inclination correction.

In a scanning electron microscope 101, an extraction electric field is formed between a field emission cathode 1 and an extraction electrode 2 by a power supply V1 and a primary electron beam 3 is extracted. The power supply V1 is controlled by a first high-voltage control circuit 41.

The primary electron beam (charged particle beam) 3 extracted in this manner is accelerated by a voltage applied to an acceleration electrode 4 by a power supply V2, and undergoes focusing by a condenser lens 5 and scanning deflection by an upper scanning deflector (first deflector) 6 and a lower scanning deflector (second deflector) 7. Between the acceleration electrode 4 and the condenser lens 5, an objective aperture 8 for controlling intensity and an aperture angle of the primary electron beam 3 is arranged. Deflection intensity of each of the upper scanning deflector 6 and the lower scanning deflector 7 is adjusted so as to perform two-dimensional scanning over a sample 11 disposed on a holder 10 with a center of an objective lens 9 as a fulcrum. The power supply V2 is controlled by the first high-voltage control circuit 41. The condenser lens 5 is controlled by a converging lens control circuit 42. The upper scanning deflector 6 and the lower scanning deflector 7 are controlled by a first deflection control circuit 45. The holder 10 is controlled by a sample fine movement control circuit 48.

The primary electron beam 3 deflected by the upper scanning deflector 6 and by the lower scanning deflector 7 is further accelerated by an acceleration voltage in a later stage in an acceleration cylinder 12 provided at a passage in the objective lens 9. The primary electron beam 3 accelerated in the later stage is sharply focused by lens action of the objective lens 9. A tubular cylinder 13 is grounded and forms an electric field that accelerates the primary electron beam 3, between the tubular cylinder 13 and the acceleration cylinder 12 to which a voltage is applied by a power supply V3. The objective lens 9 is controlled by an objective lens control circuit 46. The power supply V3 is controlled by a second high-voltage control circuit 47.

Electrons such as secondary electrons or back-scattered electrons emitted from a sample are accelerated in a direction opposite to the direction of the emitted primary electron beam 3 by a negative voltage (retarding voltage) applied to the sample by a power supply V4 and an electric field formed between the tubular cylinder 13 and the acceleration cylinder 12. The secondary electrons 14 collide with a reflector plate 15 and are converted into tertiary electrons (charged particles) 16, which are guided to a detector 17 so as to form an SEM image. The reflector plate 15 has a hole through which the primary electron beam 3 passes, and is arranged between the condenser lens 5 and the objective lens 9. The power supply V4 is controlled by a third high-voltage control circuit 49. The tertiary electron 16 detected at the detector 17 is transmitted to a control device 50 via a signal control circuit.

Between the condenser lens 5 and the reflector plate 15, an upper deflector 18 and a lower deflector 19 for deflecting the primary electron beam 3 are arranged. These deflectors have a deflecting action by one or both of a magnetic field and an electric field. Deflection intensity of each of the upper deflector 18 and the lower deflector 19 is adjusted such that the primary electron beam 3 passes through the center of the objective lens 9 and is directed onto the sample 11. The upper deflector 18 and the lower deflector 19 are adjusted by a second deflection control circuit 43.

The electron detected at the detector 17 is amplified by an amplifier 44 and displayed on an image display device 51 in synchronization with a scanning signal supplied to the upper scanning deflector 6 and to the lower scanning deflector 7. An obtained image is stored in a frame memory 502. It is possible to configure such that a current or voltage applied to each of components of the scanning electron microscope illustrated in FIG. 1 is controlled by the control device 50 provided separately from a scanning electron microscope main body 54. Specifically, the control device 50 applies a current or a voltage to each of the components of the scanning electron microscope via the first high-voltage control circuit 41, the converging lens control circuit 42, the second deflection control circuit 43, the first deflection control circuit 45, the objective lens control circuit 46, the second high-voltage control circuit 47, the third high-voltage control circuit 49, and the sample fine movement control circuit 48. The control device 50 includes a CPU 501, the frame memory 502, and a storage device 503 for storing programs and data. Programs and data are input into the control device 50 via an input device 52.

Next, a case where the primary electron beam is incident with inclination to a sample and a problem caused by this will be described with reference to FIGS. 2, 3(a), and 3(b).

Figure 2:
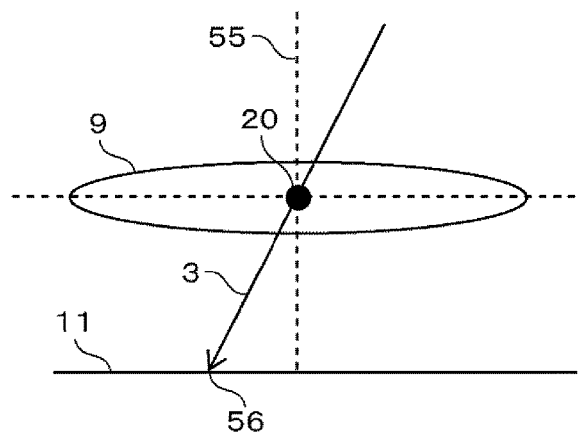
FIG. 2 is a diagram illustrating inclined incidence of a primary electron beam to a sample.
Figure 3A:
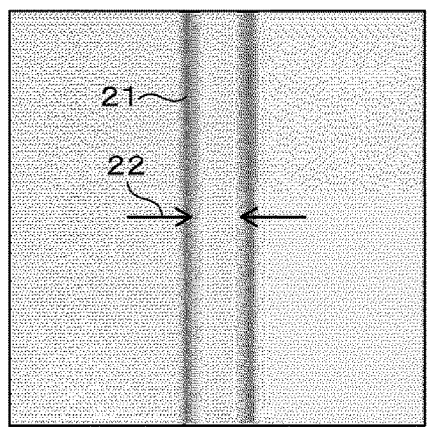
FIGS. 3A and 3B are diagrams illustrating dimensional measurement values.
Figure 3B:
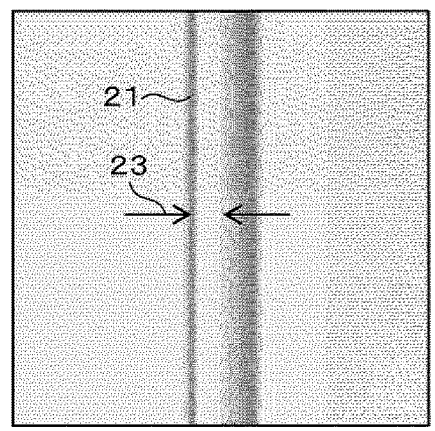

FIG. 2 is a diagram illustrating inclined incidence of the primary electron beam to the sample. FIGS. 3(a) and 3(b) are diagrams illustrating dimensional measurement values. FIG. 3(a) illustrates a case where the primary electron beam is not inclined. FIG. 3(b) illustrates a case where the primary electron beam is inclined.

An ordinary optical axis adjustment includes execution of wobbling that periodically changes an excitation current of an electron lens such as the condenser lens 5 and the objective lens 9 and then, adjustment is performed so as to achieve a state in which a pattern image of the sample 11 does not move at the time of wobbling. At this time, the primary electron beam 3 passes through the center of each of the electron lenses. Unfortunately, however, since a mechanical tolerance is inevitably present in an actual device, each of the electron lenses is not arranged concentrically. Accordingly, as illustrated in FIG. 2, even when the primary electron beam 3 passes through an objective lens center 20 immediately above the sample 11, the primary electron beam 3 is incident with inclination to the sample 11. With this configuration, even when the primary electron beam 3 passes through the objective lens center 20, the primary electron beam 3 is not incident on an intersection of the sample 11 and an optical axis 55 of the objective lens 9.

Inclined incidence, in this manner, of the primary electron beam 3 to the sample 11 would cause a problem when a deep groove pattern 21 is measured. Specifically, as illustrated in FIG. 3(a), in a case where the primary electron beam 3 is not inclined, a width of a groove bottom is measured as a dimensional measurement value 22. In contract, as illustrated in FIG. 3(b), in a case where the primary electron beam 3 is inclined, the pattern is observed unevenly, leading to an observation result with a dimensional measurement value 23. This means that an obtained dimensional measurement value does not reflect a real width of the groove bottom.

In a case where the primary electron beam 3 is not inclined and passes through the objective lens center 20, the primary electron beam 3 reaches a position on the optical axis, and thus, an emission position of the secondary electron 14 is to be on the optical axis. In contrast, in a case where the primary electron beam 3 passes through the objective lens center 20 and reaches at a position off-axis from the optical axis 55, the primary electron beam 3 is inclined with respect to the sample 11. This would cause the secondary electron 14 to be emitted from an off-axis position 56 from the optical axis 55, meaning there is a correlation between the inclination angle of the primary electron beam 3 and the emission position of the secondary electron 14.

Figure 5:
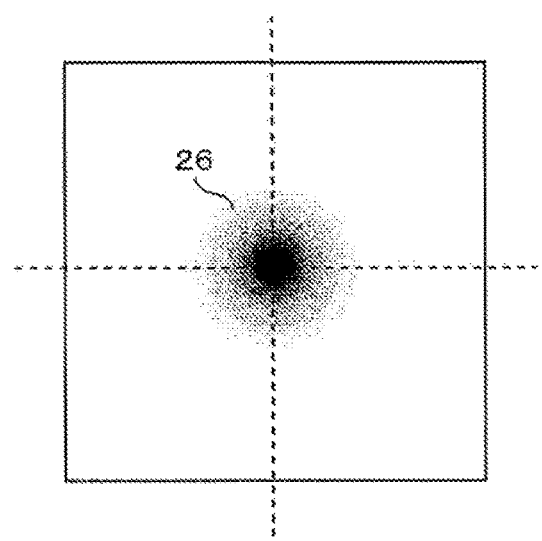
FIG. 5 is a diagram illustrating a black point image formed by a secondary electron scanning image.
Figure 6:
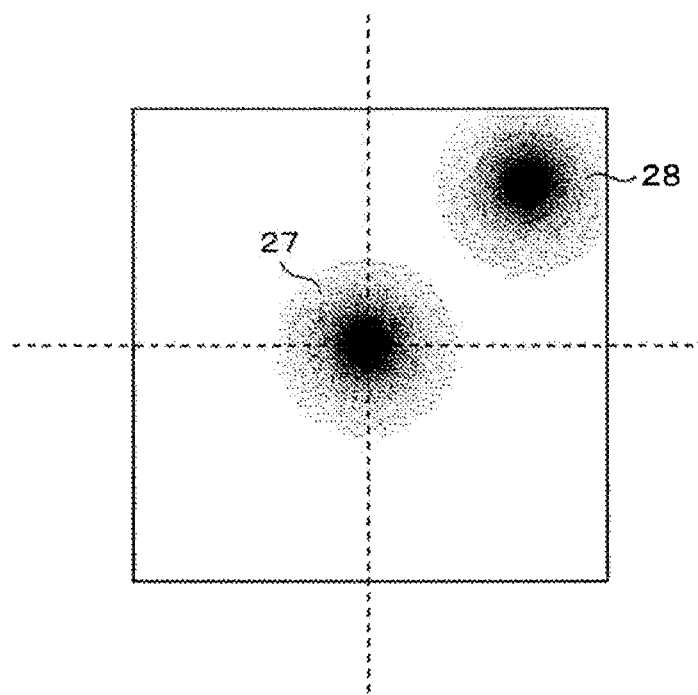
FIG. 6 is a diagram illustrating deviation of the black point due to inclination of the primary electron beam.

Hereinafter, a method to correct inclination of the primary electron beam 3 with respect to the sample 11 and a device to achieve the correction will be described with reference to FIGS. 4 to 6.

Figure 4:
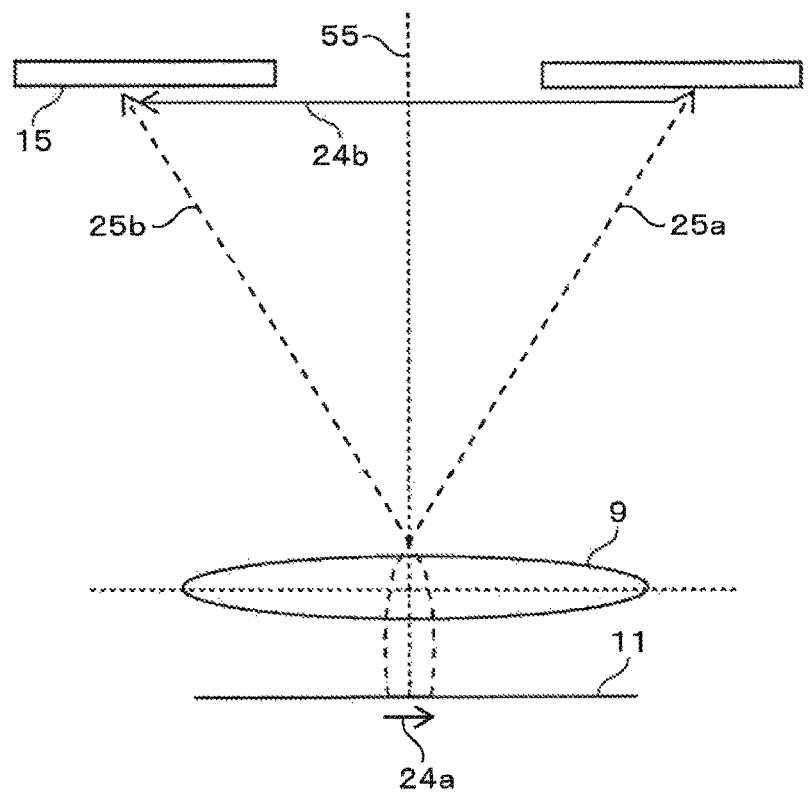
FIG. 4 is a diagram illustrating a change in a secondary electron trajectory by an objective lens.

FIG. 4 is a diagram illustrating a change in a secondary electron trajectory by the objective lens. FIG. 5 is a diagram illustrating a black point image formed by a secondary electron scanning image. FIG. 6 is a diagram illustrating a position deviation of the black point due to inclination of the primary electron beam.

In the present embodiment, inclination correction of the primary electron beam 3 is performed by monitoring the emission position of the secondary electron 14 in observation of a scanning image of the secondary electron 14 on the reflector plate 15. The reason for performing inclination correction of the primary electron beam 3 with respect to the sample in observation of the scanning image of the secondary electron 14 lies in its capability of performing high-precision inclination angle correction. As illustrated in FIG. 4, in a case where the emission position of the secondary electron 14 changes by a distance 24a on the sample 11, trajectories of the secondary electron 14 before/after the change would be a trajectory 25a and a trajectory 25b respectively, due to a lens action of the objective lens 9. Along with this, the distance 24a would be enlarged to be a distance 24b when it is projected on the reflector plate 15. Accordingly, it is possible to perform high-precision observation of inclination of the primary electron beam 3.

Similarly to the primary electron beam 3, the secondary electron 14 emitted from the sample 11 undergoes a scanning deflection action of the upper scanning deflector 6 and the lower scanning deflector 7. In observation of a low-magnification SEM image with an increased scanning deflection amount in each of the upper scanning deflector 6 and the lower scanning deflector 7, wide-range scanning of the secondary electron 14 is performed on the reflector plate 15, and as a result, a scanning image on the reflector plate 15 with the secondary electron 14 would be observed on the detector 17, as illustrated in FIG. 5. A black point 26 within a screen corresponds to an opening that allows the primary electron beam 3 to pass through, provided on the reflector plate 15. At an opening portion, a luminance is low because the secondary electron 14 passes through the reflector plate 15 and thus is not detected. In other words, the reflector plate 15 has an opening that allows the secondary electron 14 to pass through. Although not illustrated in FIG. 1, in a case where the detector 17 is arranged at a position closer to the condenser lens 5 rather than to the reflector plate 15, a contrast is inversed to cause the scanning image on the reflector plate 15 to be observed as a while point image. The following will be described on an assumption that the black point image is obtained.

The secondary electron 14 generated on the optical axis and the secondary electron 14 generated at an off-axis position have different trajectories. Accordingly, the position of a black point of an obtained black point image on the reflector plate 15 changes depending on whether the primary electron beam 3 is inclined or not. In a case where the primary electron beam 3 is not inclined, the secondary electron 14 is emitted from a position on the optical axis. The secondary electron 14 emitted perpendicularly undergoes deflection by the objective lens 9, and thus, forms a black point 27 at a center of an SEM image as illustrated in FIG. 6. In contrast, in a case where the primary electron beam 3 is inclined, the secondary electron is emitted from an off-axis position. In this case, even when emission is performed perpendicularly, the secondary electron undergoes deflection by the objective lens 9 as illustrated in FIG. 4, and thus, forms a black point 28 at a position deviating from the center of the SEM image.

It is understandable, from the above, that in a state where the primary electron beam 3 passes through the center of the objective lens 9 and is not inclined with respect to the sample 11, the black point position does not move but only the size of the black point changes when wobbling of the objective lens 9 is executed. Accordingly, in order to achieve a state where the primary electron beam 3 is not inclined, it may be appropriate to change the trajectory of the primary electron beam 3 using the upper deflector 18 and the lower deflector 19 while executing wobbling of the objective lens 9 for that period, and to set, onto the device, conditions of the upper deflector 18 and the lower deflector 19 that minimize the amount of movement of the black point position. Wobbling of the objective lens 9 is executed by changing the excitation current of the objective lens 9. The deflector to change the trajectory of the primary electron beam 3 would be satisfactory if it includes at least two stages of the upper deflector 18 and the lower deflector 19. Alternatively, the deflector may have three or more stages.

Note that a technique to change the black point position is not limited to wobbling of the objective lens 9. Another technique may be used as long as it can change the trajectory of the secondary electron 14. For example, it is allowable to execute wobbling of a retarding voltage (deceleration voltage) applied to the sample 11 or a voltage of the acceleration cylinder 12 (acceleration cylinder voltage).

In summary, in the present embodiment, a two-stage charged particle beam deflector is arranged between a charged particle source and an objective lens used to focus a charged particle beam. The charged particle beam deflector deflects a charged particle beam emitted from the charged particle source. A current or voltage with an inverted phase is applied to the two-stage charged particle beam deflector so as to swing back the charged particle beam to cause the charged particle beam to pass through the objective lens center. At this state, a secondary electron emitted from a sample by charged particle beam irradiation is deflected by a lens effect of the objective lens and when reaching a reflector plate arranged between the charged particle source and the objective lens. At this time, wobbling of the objective lens is executed while a deviation vector of the charged particle beam is being changed by the two-stage charged particle beam deflector, and a secondary electron scanning image is observed on the reflector plate at this time. Under conditions of the two-stage charged particle beam deflector under which the amount of movement of a reflector plate scanning image caused by an objective wobbler is minimized, a device state allowing the charged particle beam to pass through the objective lens center and to be incident perpendicularly to the sample is achieved.

According to the embodiment, by observing a secondary electron trajectory, it is possible to correct an inclination angle of the charged particle beam with respect to the sample. A change of the trajectory of the secondary electron is enlarged by the objective lens in observation on the reflector plate, it is possible to correct the inclination angle with high precision. Furthermore, there is no need to perform a preliminary measurement of the inclination angle. Even in a case where the inclination angle is changed by charged electricity, it is possible to allow the charged particle beam to be incident perpendicularly to the sample.

Example 1

Figure 7:
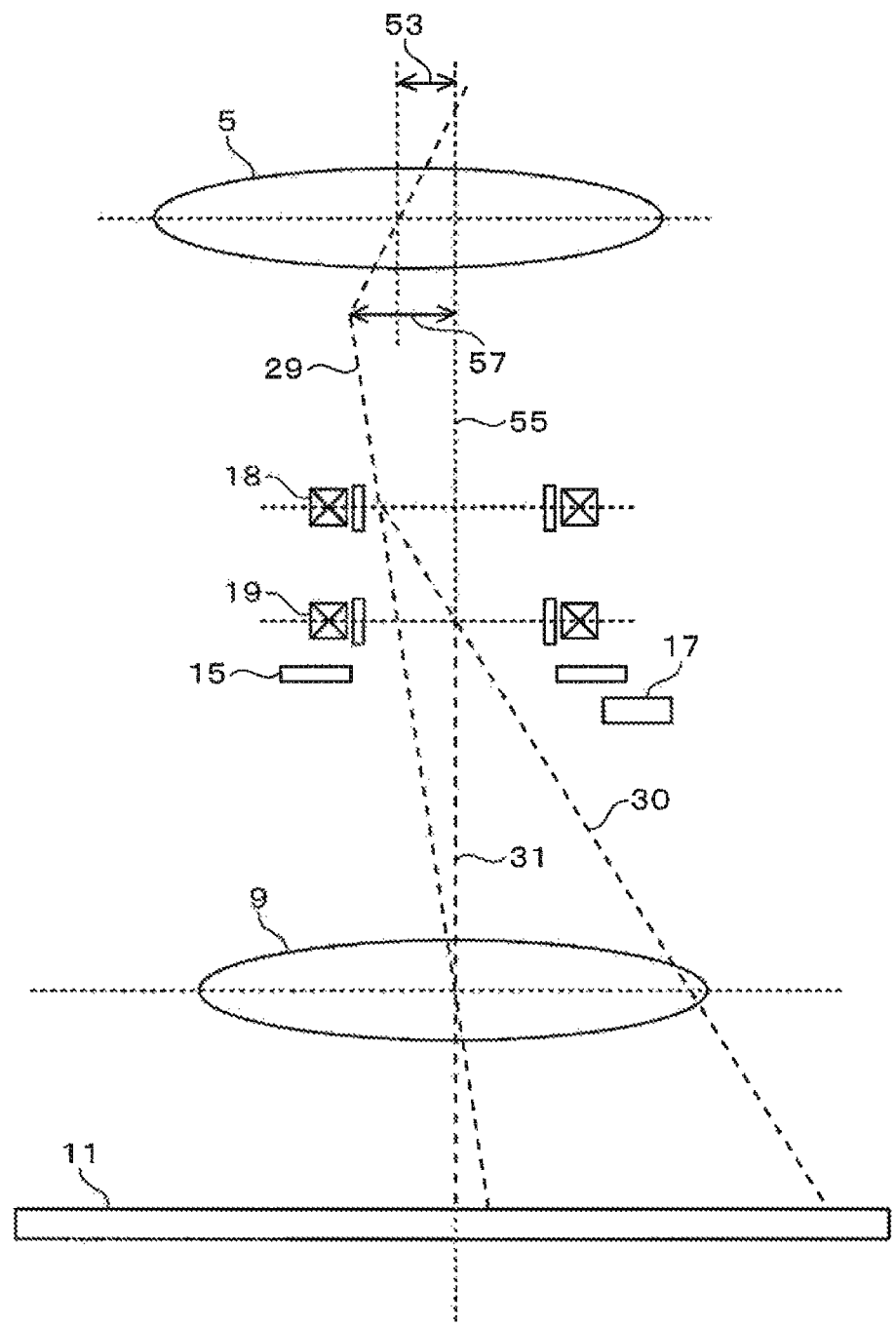
FIG. 7 is a diagram illustrating a change in the inclination of the primary electron beam by a two-stage deflector.
Figure 8:
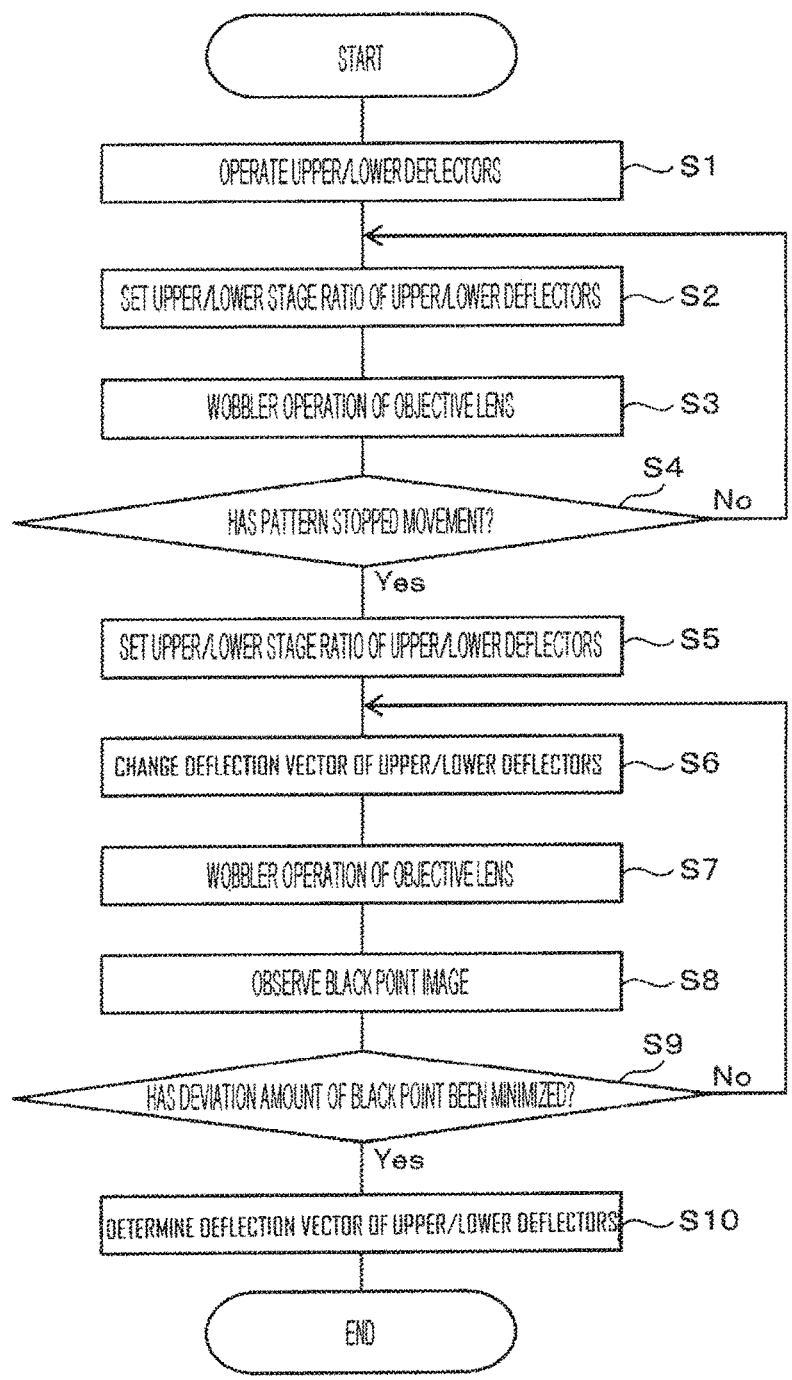
FIG. 8 is a diagram illustrating a sequence for correcting inclination of the primary electron beam.
Figure 9:
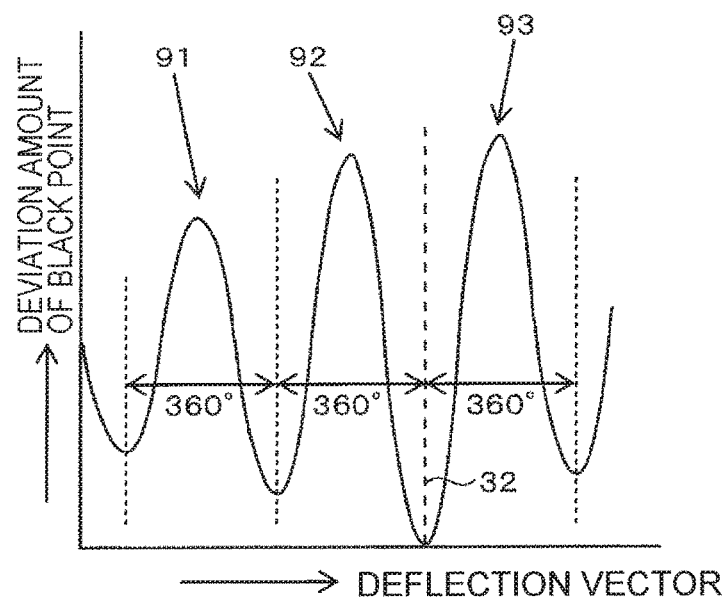
FIG. 9 is a diagram illustrating correction of inclination of the primary electron beam by measuring a deviation amount of a black point.

FIG. 7 is a diagram illustrating a change in the inclination of the primary electron beam by a two-stage deflector. FIG. 8 is a diagram illustrating a sequence for correcting inclination of the primary electron beam. FIG. 9 is a diagram illustrating a deviation amount of the black point position when wobbling of the objective lens 9 is executed.

With reference to FIGS. 7 and 8, an exemplary flow of primary electron beam inclination correction in a case where the centers of the condenser lens 5 and the objective lens 9 deviate due to mechanical axis deviation 53, as illustrated in FIG. 1, will be described. In ordinary adjustment to cause the primary electron beam to pass through the electron lens center, the primary electron beam would have an axis that passes through the center of each of the condenser lens 5 and the objective lens 9. Accordingly, the trajectory would be like a primary electron beam trajectory 29 and be incident with inclination to the sample 11. At a stage where the primary electron beam passes through the condenser lens 5, the beam has deviated by a distance of 57 with respect to the optical axis 55.

In order to correct the inclination angle with respect to the sample 11, the upper deflector 18 and the lower deflector 19 are started to operate (step S1 in FIG. 8). A current or voltage with an inversed phase is applied to the upper deflector 18 and the lower deflector 19. The primary electron beam deflected by the upper deflector 18 changes from the trajectory 29 to a trajectory 30, and then, is swung back by the lower deflector 19 in an inversed direction to be a trajectory 31. At this time, an upper/lower stage ratio of deflection intensities of the upper deflector 18 and the lower deflector 19 is adjusted such that the primary electron beam passes through the center of the objective lens 9 (step S2).

For adjustment of the upper/lower stage ratio, it may be appropriate to use an ordinary axis adjustment technique of achieving a state in which a pattern on the sample 11 does not move when wobbling of the objective lens 9 is executed (steps S3 and S4). For example, it is possible to fix the deflection intensity of any one of the upper deflector 18 and the lower deflector 19 and change the deflection intensity of the other deflector so as to set, as a condition, the upper/lower stage ratio that achieves a state in which a wobbling image does not move (step S5). Note that the magnitude of applied current or voltage to each of the upper deflector 18 and the lower deflector 19 when the upper/lower stage ratio is obtained may be arbitrarily determined as long as it is within a range to allow observation of the SEM image.

However, performing adjustment of the upper/lower stage ratio of the upper deflector 18 and the lower deflector 19 alone would leave the primary electron beam in a state of still being incident with inclination to the sample 11. Inclination angle correction is, therefore, performed by changing the deflection vector of each of the upper deflector 18 and the lower deflector 19 while maintaining the upper/lower stage ratio at this time (step S6).

Whether the primary electron beam is incident perpendicularly to the sample is determined by executing wobbling of the objective lens 9 while changing the deflection vector of each of the upper deflector 18 and the lower deflector 19 (step S7), and observing the black point image at that time (step S8). The horizontal axis in FIG. 9 corresponds to the deflection vector of the upper deflector 18 and the lower deflector 19. FIG. 9 illustrates an exemplary measurement in which the deviation amount of the black point is measured while, at first, a phase of the deflection vector alone is changed for 360°, and then, the magnitude of the deflection vector is changed. Accordingly, an interval between the peaks or between the bottoms corresponds to a deflection phase of 360°. A plurality of peaks and bottoms exists because the magnitude of the deflection vector has been changed. Each of peaks 91, 92, and 93 has different magnitude of deflection.

In FIG. 9, the deflection vector that minimizes the deviation amount of the black point is determined (step S9). Herein, the deviation amount of the black point at the time of wobbling is minimized in the deflection vector indicated by a broken line 32. Accordingly, when the setting of the deflection vector of each of the upper deflector 18 and the lower deflector 19 has been performed according to the condition of the broken line 32 (step S10) and when the primary electron beam has been deflected with this state, it is expected that the inclination angle of the primary electron beam with respect to the sample 11 has been corrected, namely, the primary electron beam is incident perpendicularly to the sample.

As described above, according to the present embodiment, it is possible to set, with high precision, conditions of the primary electron beam that passes through the center of the objective lens and is incident perpendicularly to the sample. Furthermore, even in a case where an inclination of the primary electron beam is changed due to an influence of charged electricity, or the like, it is possible to correct the inclination including the influence of the charged electricity. Accordingly, this correction method can be a significant technique in SEM observation of a sample with deep grooves and deep holes having possibility of strong charged electricity.

Example 2

Figure 10:
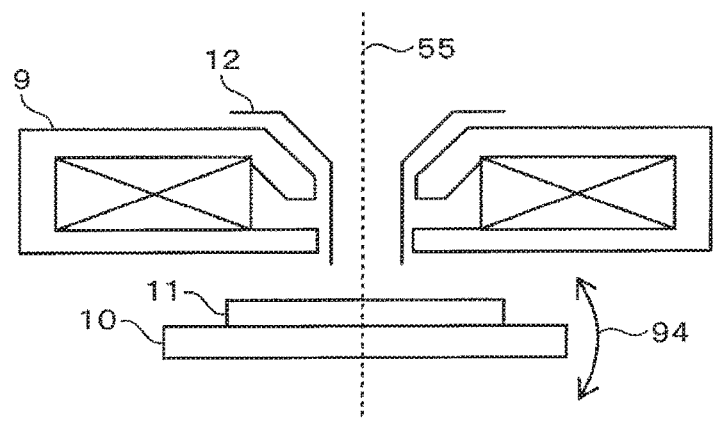
FIG. 10 is a diagram illustrating parallelism adjustment between an objective lens and a sample.

FIG. 10 is a diagram illustrating parallelism adjustment between the objective lens and the sample.

In order to reduce the deviation amount of the black point in the deviation vector illustrated by the broken line 32 in FIG. 9 to zero, it is required to arrange the objective lens 9 and the sample 11 in parallel with each other. When the objective lens 9 and the sample 11 are not arranged in parallel with each other, the secondary electron would be deflected when reaching the reflector plate 15. To cope with this, as illustrated in FIG. 10, it is possible to configure such that an inclination mechanism may be provided on the holder 10 so as to operate as indicated by an arrow 94. This operation can be used to set the condition to a sample inclination condition in which the deviation amount of the black point becomes zero in the deviation vector indicated by the broken line 32. With this configuration, it is possible adjust the parallelism between the objective lens 9 and the sample 11 with high precision.

Example 3

Figure 11A:
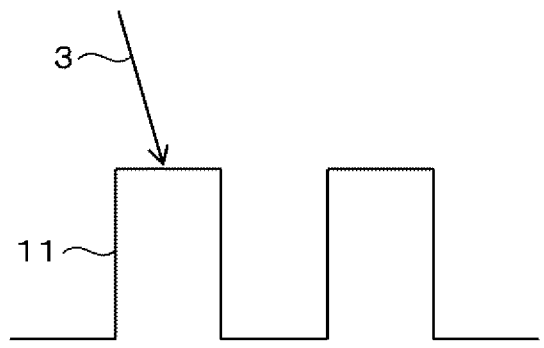
FIGS. 11A and 11B are diagrams illustrating pattern shading due to inclination of the primary electron beam.
Figure 11B:
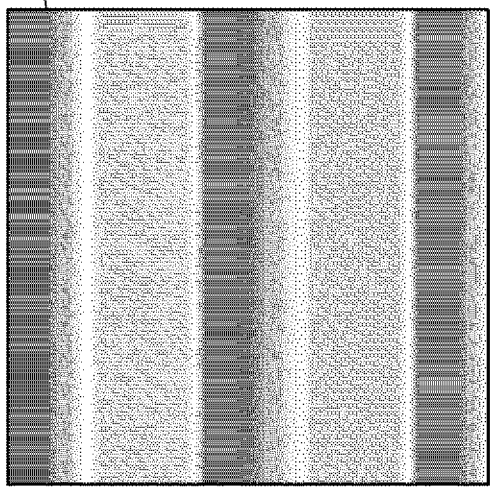

FIGS. 11(*a*) and 11(*b*) are diagrams illustrating pattern shading due to inclination of the primary electron beam. FIG. 11(*a*) is a sectional view of the sample and FIG. 11(*b*) is an observation pattern of the sample.

By using the technique of the present embodiment, it is possible to set the conditions not only for correcting inclination of an electron beam but also, conversely, for allowing the electron beam to have a large inclination. For this, it may be appropriate, in FIG. 9, to set a deviation vector of the upper deflector 18 and the lower deflector 19 to the peak conditions having an increased deviation amount of the black point. By causing the electron beam 3 to be incident to the sample 11 with large inclination in a case where there is unevenness in height on the observation pattern, it is possible to provide shading (gradation) as illustrated in a pattern shading 33 generated by inclination of the primary electron beam illustrated in FIG. 11(*b*). This makes it possible to apply the technique to unevenness determination of the sample.

The present invention made by the present inventor has been described in detail according to the embodiments and the examples. It is understandable that the present invention is not limited to the above-described embodiments and examples but can also be modified in a variety of forms.

REFERENCE SIGNS LIST

1 field emission cathode
2 extraction electrode
3 primary electron beam
4 acceleration electrode
5 condenser lens
6 upper scanning deflector
7 lower scanning deflector
8 objective aperture
9 objective lens
10 holder
11 sample
12 acceleration cylinder
13 tubular cylinder
14 secondary electron
15 reflector plate
16 tertiary electron
17 detector
18 upper deflector
19 lower deflector
20 objective lens center
21 deep groove pattern
22 dimensional measurement value of groove bottom width when primary electron beam is not inclined
23 dimensional measurement value of groove bottom width when primary electron beam is inclined
24*a* deviation amount of secondary electron emitting position on sample
24*b* deviation amount of secondary electron emitting position on reflector plate
25*a* trajectory of secondary electron emitted from off-axis position
25*b* trajectory of secondary electron emitted from off-axis position
26 black point
27 black point position when primary electron beam is not inclined
28 black point position when primary electron beam is inclined
29 primary electron beam trajectory with mechanical axis deviation
30 trajectory of primary electron beam deflected by upper deflector
31 trajectory primary electron beam swung back by lower deflector
32 upper/lower deflector condition for correcting inclination of primary electron beam with respect to sample
33 pattern shading due to inclination of primary electron beam
41 first high-voltage control circuit
42 converging lens control circuit
43 second deflection control circuit
44 amplifier
45 first deflection control circuit
46 objective lens control circuit
47 second high-voltage control circuit
48 sample fine movement control circuit
49 third high-voltage control circuit
50 control device
501 CPU
502 frame memory
503 storage device
51 image display device
52 input device
53 mechanical axis deviation
55 optical axis
56 off-axis position from optical axis
57 distance of deviation with respect to optical axis
91, 92, 93 peak
94 arrow
V1, V2, V3, V4 power supply

The invention claimed is:

1. A charged particle beam inclination correction method comprising:
   in a state where a charged particle beam emitted from a charged particle source is directed toward a sample,
   performing inclination correction of the charged particle beam based on information, obtained on a reflector plate, regarding a scanning image formed with an emitted charged particle emitted from the sample after the charged particle beam passes through an opening of the reflector plate, wherein the reflector plate is arranged between the charged particle source and an objective lens that focuses the charged particle beam, including
   controlling the objective lens to execute a first wobbling in which a lens condition of the objective lens is changed;
   adjusting an upper charged particle deflector and a lower charged particle deflector to suppress displacement of a pattern obtained based on an output of a detector;

controlling the objective lens to execute a second wobbling in which a lens condition of the objective lens is changed; and determining deflection vectors of the upper charged particle deflector and the lower charged particle deflector to suppress position movement of the center of the scanning image in the second wobbling on the scanning image based on the output of the detector when changing the deflection vectors of the upper charged particle deflector and the lower charged particle deflector while maintaining a signal ratio of the upper charged particle deflector and the lower charged particle deflector adjusted by the first wobbling, in a state in which the second wobbling is being performed.

2. The charged particle beam inclination correction method according to claim 1,
wherein the upper charged particle deflector and the lower charged particle deflector are arranged between the charged particle source and the objective lens.

3. The charged particle beam inclination correction method according to claim 1,
wherein the reflector plate includes an opening through which the emitted charged particle can pass.

4. The charged particle beam inclination correction method according to claim 1,
wherein the information, on the reflector plate, regarding the scanning image with the emitted charged particle is information regarding a position, on the reflector plate, of the emitted charged particle deflected by the objective lens.

5. The charged particle beam inclination correction method according to claim 2,
wherein the deflector includes a deflection action by a magnetic field, a deflection action by an electric field, or a deflection action by the magnetic field and the electric field.

6. The charged particle beam inclination correction method according to claim 2,
wherein a deviation vector of the deflector is changed based on the information regarding the scanning image with the emitted charged particle on a reflector plate.

7. The charged particle beam inclination correction method according to claim 4,
wherein the position of the emitted charged particle on the reflector plate is changed according to a change in an excitation current of the objective lens, a change in an acceleration cylinder voltage immediately above the objective lens, or a change in a deceleration voltage applied to the sample.

8. A charged particle beam device comprising:
a charged particle source;
an objective lens that focuses a charged particle beam emitted from the charged particle source;
a charged particle detector arranged between the charged particle source and the objective lens;
upper and lower charged particle beam deflectors arranged between the charged particle source and the objective lens;
a reflector plate arranged between the charged particle source and the objective lens; and
a controller coupled to the objective lens, the upper charged particle beam deflector and the lower charged particle beam deflector, configured to:

control the objective lens to execute a first wobbling in which a lens condition of the objective lens is changed;
adjust the upper charged particle beam deflector and the lower charged particle beam deflectors so as to suppress the displacement of the pattern obtained based on the output of the detector;
control the objective lens to execute a second wobbling in which a lens condition of the objective lens is changed; and
determine deflection vectors of the upper charged particle beam deflector and the lower charged particle beam deflector to suppress the position movement of the center of a scanning image in the second wobbling on the image based on the output of the detector when changing the deflection vectors of the upper charged particle beam deflector and the lower charged particle beam deflector while maintaining the signal ratio of the upper charged particle beam deflector and the lower charged particle beam deflector adjusted by the first wobbling, in the state in which the second wobbling is being performed.

9. The charged particle beam device according to claim 8, wherein the reflector plate includes an opening through which the charged particle can pass.

10. The charged particle beam device according to claim 8, wherein the information, on the reflector plate, regarding the scanning image with the charged particle is information regarding a position, on the reflector plate, of the charged particle deflected by the objective lens.

11. The charged particle beam device according to claim 8, wherein each of the upper and lower charged particle beam deflectors has a deflection action by a magnetic field, a deflection action by an electric field, or a deflection action by the magnetic field and the electric field.

12. The charged particle beam device according to claim 8, wherein a deviation vector of each of the upper and lower charged particle beam deflectors is changed based on the information, on the reflector plate, regarding the scanning image with the charged particle.

13. The charged particle beam device according to claim 11, wherein a position of the charged particle on the reflector plate is changed according to a change in an excitation current of the objective lens.

14. The charged particle beam device according to claim 11, comprising:
a first power supply that applies a voltage that accelerates the charged particle beam immediately above the objective lens; and
a second power supply that applies a voltage that decelerates the charged particle beam to a sample,
wherein a position of the charged particle on the reflector plate is changed according to a change in an acceleration cylinder voltage immediately above the objective lens by the first power supply or according to a change in a deceleration voltage applied to the sample by the second power supply.

15. The charged particle beam device according to claim 8, wherein the charged particle detector detects a charged particle from the reflector plate.

* * * * *